United States Patent [19]

Kawai et al.

[11] Patent Number: 4,596,454
[45] Date of Patent: Jun. 24, 1986

[54] PHOTOGRAPHIC LENS BARREL ASSEMBLY

[75] Inventors: Tohru Kawai; Akiyasu Sumi; Hidefumi Notagashira; Hiroshi Yamamoto, all of Kanagawa, Japan

[73] Assignee: Canon Kabushiki Kaisha, Tokyo, Japan

[21] Appl. No.: 532,583

[22] Filed: Sep. 15, 1983

[30] Foreign Application Priority Data

Sep. 21, 1982 [JP] Japan .................... 57-141945[U]
Feb. 18, 1983 [JP] Japan .................... 58-26670

[51] Int. Cl.$^4$ ............................................ G03B 17/14
[52] U.S. Cl. .................................................... 354/286
[58] Field of Search ................ 354/286; 174/69, 86

[56] References Cited

U.S. PATENT DOCUMENTS

| 3,433,889 | 3/1969 | De Vries | 174/69 |
| 3,979,763 | 9/1976 | Mills | 174/86 X |
| 4,247,190 | 1/1981 | Hashimoto et al. | 354/286 |
| 4,416,526 | 11/1983 | Tomori et al. | 354/286 X |

FOREIGN PATENT DOCUMENTS

| 1360788 | 4/1963 | France | 174/69 |
| 607082 | 11/1978 | Switzerland | 354/226 |

OTHER PUBLICATIONS

Hughes–Industrial Systems Div., L.A., Calif. "Contour" Cable Advertisement, 10/1960.

Primary Examiner—Michael L. Gellner
Attorney, Agent, or Firm—Toren, McGeady, Stanger, Goldberg & Kiel

[57] ABSTRACT

An electrical signal transmission arrangement in a photographic lens barrel which is principally composed of an adapter member arranged to be non-rotatably carried by a camera body and a lens body arranged to be rotatable around an optical axis relative to the adapter member and which is equipped for electrical signal transmission between the adapter member and the lens body.

3 Claims, 16 Drawing Figures

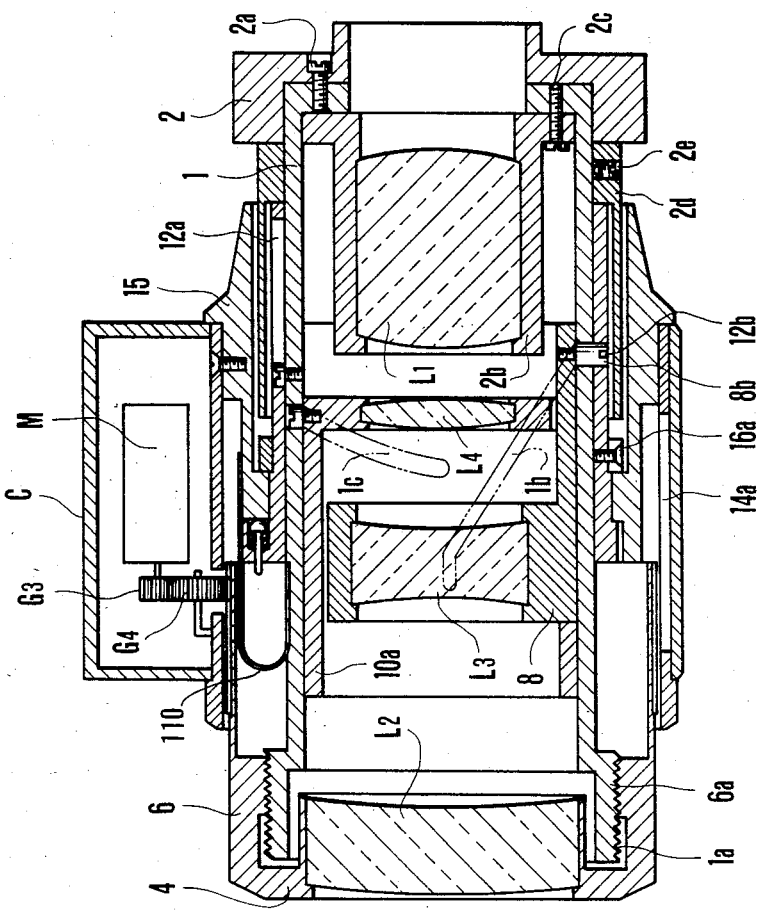

PHOTOGRAPHIC LENS BARREL ASSEMBLY

BACKGROUND OF THE INVENTION

1. Field of the Invention:

This invention relates to photographic lens barrel and more particularly to a lens barrel having input-and-output means for electrical signal exchange with a camera body and means which is arranged within the body of the lens barrel to be controlled and driven by an electrical signal.

2. Description of the Prior Art:

The lens barrel to which this invention relates is of the type suitable for use as an interchangeable lens arranged to be freely attachable to and detachable from a camera body.

The conventional mounting arrangements for interchangeable lens barrels include: the type wherein the entire lens barrel assembly is rotated when attaching it to the camera; the spigot type in which the lens barrel is attached to the camera by a bayonet tightening ring provided on the periphery of one end of the lens barrel; and the latest type which has been developed by the present applicants and covered by and described in U.S. Pat. Nos. 4,247,190, 4,230,403, 4,281,916, 4,317,627 and 4,302,077.

The lens barrel of this latest type principally comprises, as disclosed in U.S. Pat. No. 4,230,403, an adapter shell 8 which is arranged to be non-rotatably secured to a camera body and a lens body which consists of a lens barrel 1 (or a main support tube 1) and a ring 4 arranged to be rotatable around an optical axis relative to the adapter shell 8. The lens body has a photo-taking lens and a diaphragm attached thereto.

In the above-stated latest type lens barrel assembly, a signal member which is provided for exposure control between the camera and the interchangeable lens is attached to the adapter shell. The signal member is arranged to be always kept in a predetermined position when the lens barrel is attached and detached to and from the camera, so that the signal member can be always smoothly interlinked with a corresponding member arranged on the camera body.

A recent conspicuous technological advance in cameras involves the advent of automatic focusing devices. These automatic focusing devices include a first type which is arranged to guide reflected light coming from a photographing object via a photo-taking lens to a distance measuring element disposed on the side of a camera body and to control the shift of the photographic lens on the basis of a signal produced by the distance measuring element; and a second type having a distance measuring element, a distance measurement control circuit and photographic lens driving means all arranged within the interchangeable lens barrel.

The first type necessitates use of signal transmission device for exchange of electrical signals between the camera and the interchangeable lens barrel.

The second type also requires a signal transmission device for signal transmission between the camera and the lens barrel when the light quantity of a flash device is to be controlled by sending a distance measurement signal from the lens barrel to the camera body.

The recent technological advance in camera systems also has resulted in the application of electronics for improvement in the accuracy of electrical signal control between the camera body and the lens barrel. Such improvement includes provision of a stepping motor for aperture control; electrification of the photographic lens by adoption of an automatic focusing device; and an electrical zooming arrangement for a zoom lens.

The application of electronics to camera systems also has come to necessitate use of a device for electrical signal exchange between the camera body and the lens barrel. However, the electrical signal exchange device is greatly dependent on the type of the above-stated mounting arrangement of the interchangeable lens barrel.

In the type wherein the entire lens assembly may be rotated during mounting, a bayonet mount is provided at the end of the lens barrel and the bayonet mount is engaged with a corresponding bayonet mount provided on the camera body side with the lens barrel being attached to the camera by turning the whole lens barrel around the optical axis as mentioned in the foregoing. For this type, electrical signal receiving-and-producing means can be arranged without much difficulty by providing contact pins on the mount surface of the lens barrel and that of the camera body in a manner as disclosed in U.S. Pat. No. 4,357,089.

However, in the case of the lens barrel which is provided with the above-stated new type mounting device, the adapter shell and the lens body are arranged to be rotatable relative to each other and it is difficult to use the conventionally known electrical signal transmission device for the lens barrel because in the new type mounting device, the adapter shell which is arranged to engage the mounting surface of the bayonet mount of the camera body is rotatable relative to the lens body and, with a diaphragm, a stepping motor for driving the diaphragm, etc. arranged in the lens body, the signal receiving-and-producing means (or input-and-output means) such as the contact pins provided on the adapter shell must be provided with some arrangement for electrical signal transmission between the signal receiving-and-producing means and the motor or the like and a motor control circuit.

Lens barrels generally have a very tight structural arrangement without leaving vacant spaces therein to meet the requirement of the market for reduction in size and weight. Use of some wiring arrangement such as the one disclosed by Japanese Utility Model Publication No. SHO 52-60833 is difficult in view of the requirement for reduction in size and weight. Therefore, the interchangeable lens barrel provided with the above-stated new type mounting device has presented a problem with respect to the electrical signal transmission arrangement.

Further, with regard to the electrical signal exchange arrangement of a photographic lens barrel and particularly that of an interchangeable lens barrel, some problems still ramain unsolved. For example, in connection with the above-stated applications of electronics to a lens barrel, the unsolved problems include simplification of the electrical signal transmission arrangement within the lens barrel and obtaining sufficient reliability of the signal transmission arrangement. Another problem resides in achieving electrical signal transmission between a fixed shell and an operation member which is disposed on the outer side of the fixed shell and is arranged to be movable either around an optical axis or linearly along the optical axis. It has been known to provide the operation member with an electrical unit consisting of electrical elements and electrical circuit substrate; to arrange an input-and-output device (such as electrical signal pins and the like) at one end of the fixed shell facing the camera; and to effect electrical signal transmission between the electric unit and the input-and-output device via the fixed shell. For such an arrangement, signal transmission means consisting of an electrical conductor plate and a sliding brush has been considered usable. However, it has been a shortcoming of the signal transmission means that the reliability of electrical signal transmission cannot be ensured because of insufficient conduction resulting from imperfect contact due to wear of the sliding brush, insufficient contact pressure and dust. The conventional signal transmission means thus has posed a problem in terms of reliability and quality.

SUMMARY OF THE INVENTION

A first object of this invention, therefore, is to provide a novel structural arrangement of a device for electrical signal transmission within a lens barrel and particularly within a lens barrel of the kind having a member or adapter means which is arranged to carry signal receiving-and-producing means within the lens barrel and a lens body which is arranged to carry means to be driven by an electrical signal, the adapter means and the lens body being arranged to be rotatable relative to each other.

A second object of the invention is to provide signal transmission means which is applicable to a lens barrel without necessitating a major change in the structure thereof arranged to effect reduction in size and weight.

Another object of the invention is to provide a lens barrel wherein the signal transmission function is never impaired by repeated performance of the relative rotation of the above-stated adapter means and the lens body and wherein the lens barrel ensures reliability of signal transmission between the two members.

A further object of the invention is to provide a device or lens barrel structure which simplifies electrical signal transmission in a photographic lens barrel and particularly in an interchangeable lens barrel. More specifically, with input-and-output means (or signal receiving-and-producing means) which consists of electrical signal pins provided at the camera-facing end of a fixed shell of the lens barrel, the above-stated device or lens barrel structure enables electrical signal exchange to be simply and reliably carried out between the signal receiving-and-producing means and an electric unit which consists of a motor and electrical elements disposed on an operation member.

In connection with the above stated object, this invention provides a lens barrel comprising a lens barrel component (an operation member, for example) which is arranged on the outside of a fixed shell; and an electrical signal transmission device which is capable of reliably transmitting electrical signals between the fixed shell and the operation member.

These and further objects and features of the invention will become apparent from the following detailed description of preferred embodiments thereof taken in connection with the accompanying drawings.

BRIEF DESCRIPTION OF THE DRAWINGS

FIG. 5 is a partly sectional view showing an adapter member 8.

FIG. 6 is a development view showing the arrangement of the input-and-output means.

FIG. 7 is an oblique view showing a signal pin.

FIG. 8 is an oblique view showing the details of the adapter member 8.

FIG. 12 is a sectional view showing by way of example a lens barrel in which an operation member is arranged to be linearly moved along an optical axis.

DETAILED DESCRIPTION OF PREFERRED EMBODIMENTS

Figure 1:
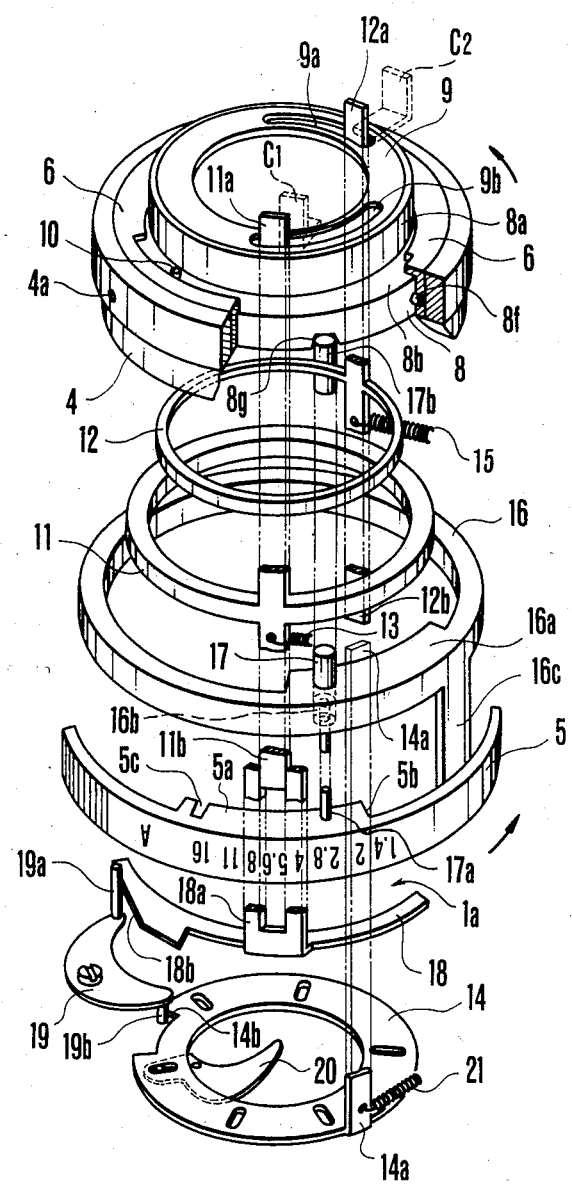
FIG. 1 is an exploded view showing the essential constituent members of a lens barrel which is provided with a mounting device suited for application of the present invention thereto.
Figure 2:
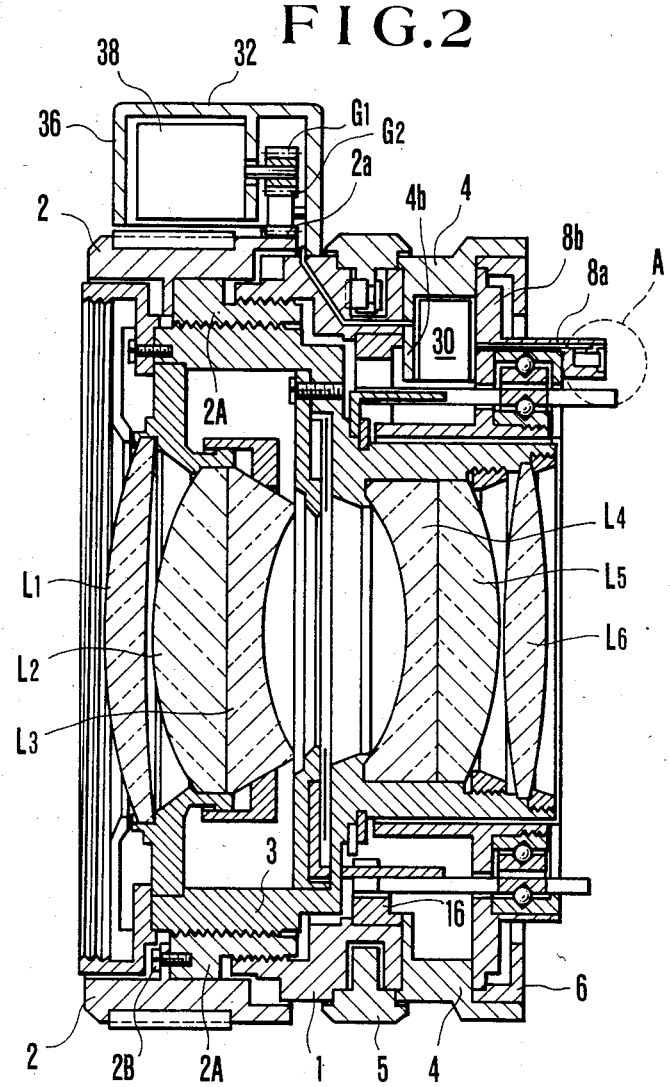
FIG. 2 is a sectional view of the lens barrel of FIG. 1 having the device according to the invention incorporated therein.

FIGS. 1-9 show a first embodiment of the present invention. FIG. 1 is an exploded view showing the main constituent members of an interchangeable lens barrel assembly which is equipped with the mounting device of the new type mentioned in the foregoing description of the prior art. FIG. 2 is a sectional view of the interchangeable lens barrel of FIG. 1 and shows a group of photo-taking lenses L1-L6 and a signal transmission member 30 in addition to the lens barrel members shown in FIG. 1. Referring to these drawings, the lens barrel assembly includes; a main support tube 1 which is annular and is provided with a screw part arranged on the inner side of its fore end to be in screwed engagement with an intermediate ring 2A; a distance ring 2 which is arranged to be manually operated and is connected to the above-stated intermediate ring 2A by means of a screw 2B; a lens carrying member 3 which carries focusing photographic lenses L1-L6 and is arranged to be in screwed engagement with the intermediate ring 2A; a bayonet ring carrying ring 4 which is secured to the main support tube 1 in one unified body therewith and has a bayonet ring 6 fixed by means of a screw to the inner surface of the fore end of the ring 4; an aperture presetting ring 5 which is fitted into annular recesses of the main support tube 1 and the carrying ring 4 and is arranged to be freely rotatable around an optical axis; and an adapter member 8 which is interposed between the rear end inner surface of the above-stated carrying ring 4 and the bayonet ring. The adapter member 8 is thus arranged to be fixed in the axial direction of the optical axis while it is rotatable around the optical axis. Further, the adapter member 8 is provided with a reference face 8b which is arranged to abut upon a mounting face disposed on the side of the camera body and a cylindrical part 8a which presents an engaging diameter when the member 8 engages the mounting member of the camera body. Signal transmission members 11 and 12 which are provided for signal exchange between the lens barrel and the camera body for exposure control are carried by the adapter member 8 via ball bearings respectively.

One end of the cylindrical part of the adapter member 8 is covered by a cover member 9 which is provided with slots 9a and 9b for allowing the above-stated signal transmission members 11 and 12 to move around the optical axis. Between the main support tube 1 and the signal transmission members 11 and 12 are arranged spring members 13 and 15 which pull these signal transmission members 11 and 12 in counterclockwise and clockwise directions respectively. A clutch ring 16 is inserted in between the rear recessed ring shaped part of the main support tube 1 and the end face of the above-stated bayonet carrying ring 4. The clutch ring 16 is arranged to be rotatable around the optical axis but is not axially movable. Further, the clutch ring 16 is provided with a projecting part 16a extending from the inner circumferential face thereof. The projecting part 16a is provided with a penetrating hole 16b having a clutch pin 17 fitted therein. The fore end 17a of the clutch pin 17 rides on a lock part 5a formed to extend in the direction of the optical axis from a part of the aforementioned aperture presetting ring 5. The other end 17b of the clutch pin 17 is fitted into a taper groove 8g formed in the lower face of the adapter member 8. An arm 11b of the signal transmission member 11 which is urged by a spring 13 is locked by one end face of the projecting part 16a of the clutch ring 16. Under a condition in which the lens is dismounted from the camera body as shown in FIG. 1, the positions of the adapter member 8 and the clutch ring 16 relative to each other are defined by the clutch pin 17. Since the position of the main support tube 1 relative to the clutch ring 16 is also defined, the signal transmission member 11 is kept at a predetermined position relative to the lens. An operation member is urged by a spring 15 to an end face of the arcuate slot 9a provided in the rear cover member 9. This causes the lens to be kept in a predetermined position under the dismounted condition. Holes 5c and 8g which are tapered are arranged to have the fore end 17a and the rear end 17b of the clutch pin 17 engage therein. Therefore, the clutch pin 17 comes in and out of these holes 5c and 8g accordingly as the clutch ring 16 is rotated. A presetting cam ring 18 is rotatably carried by the main support tube 1. A forked arm part 18a of the cam ring 18 which extends from one part of the ring 18 toward the rear end of the lens engages a second arm part 11b of the signal transmission member 11 (or an aperture signal member). The presetting cam ring 18 is provided with a cam face 18b which is arranged to have a first pin 19a of a bell crank 19 come to abut thereon. The bell crank 19 is pivotally and swingably carried by the main support tube 1. The bell crank 19 is provided with a second pin 19b which extends in a direction opposite to that of the first pin 19a. The second pin 19 engages a diaphragm aperture driving ring 14 at its engaging part 14b. The assembly includes a diaphragm blade 20 and a spring member 21. The spring member 21 is disposed between an arm part 14a of the diaphragm driving ring 14 and the main support tube 1 and is arranged to constantly urge the diaphragm blade 20 in a prescribed direction by urging the diaphragm driving ring 14 to move counterclockwise. The presetting cam ring 18, the bell crank 19, etc. jointly form a diaphragm aperture presetting mechanism. The diaphragm driving ring 14, the diaphragm blade 20, etc. form a diaphragm unit. Since the diaphragm aperture presetting mechanism and the diaphragm unit are arranged in a known manner, they require no description here.

Figure 3:
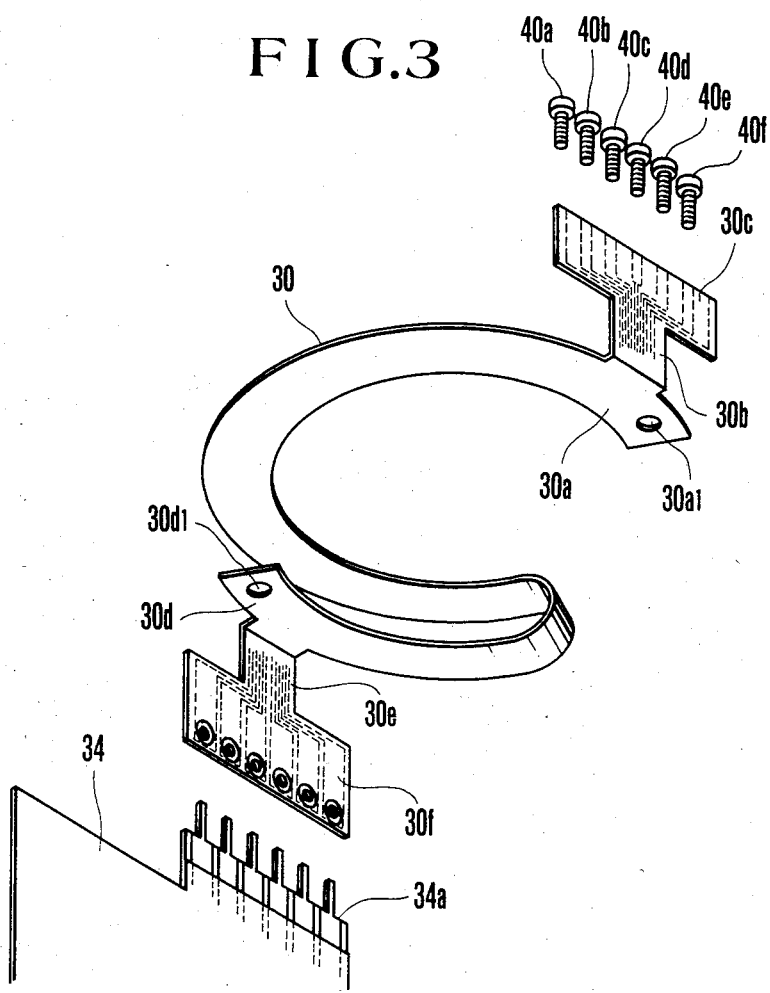
FIG. 3 is a development view of the essential parts of the device according to the invention.
Figure 4A:
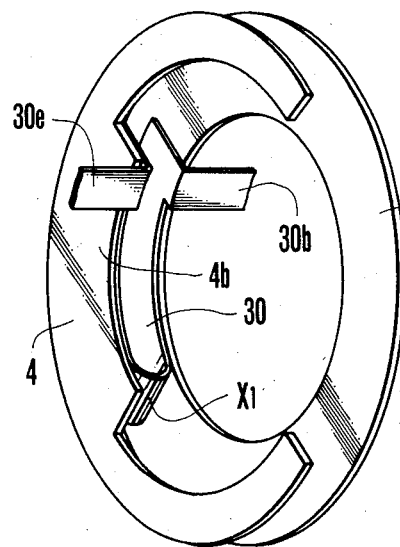
FIGS. 4A and 4B are simplified illustrations in perspective of an arrangement of a strip-like flexible signal transmission member as a main component of the invention.
Figure 4B:
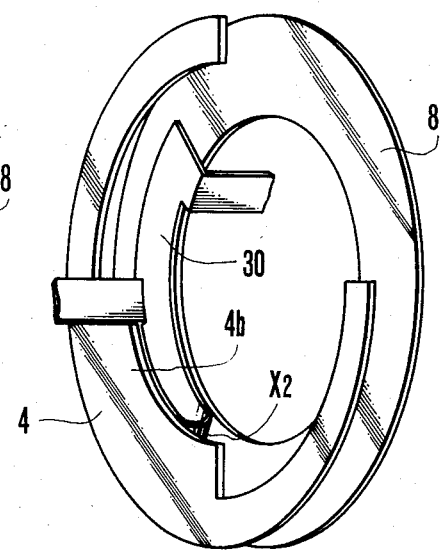

In FIG. 2, a dotted circle A indicates electrical signal producing and receiving means which will be described later herein with reference to FIGS. 5 through 8. FIG. 2 includes electrical signal transmission means 30 which is illustrated in detail in FIG. 3. As shown, the electrical signal transmission means 30 is made from a flexible wiring ring or a flexible printed circuit board and is formed into an open ring shape. One end 30a of the signal transmission means 30 is provided with an extension part. This extension part consists of an extension 30b which extends along the cylindrical part of the adapter member 8 and a connection part 30c which is arranged to connect with signal pins 40a-40f which will be described later herein. The other end of the wiring ring or flexible printed circuit board 30 is folded back. The end 30d of the folded portion is provided with an extension 30e and a connection part 30f which are arranged to extend through a penetrating hole formed in the main support tube of the lens barrel and to connect with the connection part 34a of a circuit substrate 34 provided within a lens drive control unit 32, which will be described later herein. As shown in FIG. 3, the electrical signal transmission means 30 is folded back into an approximate U-shape and is placed within a space left between the adapter means 8 and the projecting part 4b of the bayonet ring carrying ring 4 arranged inside the lens barrel as shown in FIG. 2. The extensions 30b and 30e and the connection parts 30c and 30f which are arranged at two ends of the signal transmission means 30 are respectively connected to the signal receiving-and-producing device A and the circuit substrate 34. The two ends 30a and 30d of the signal transmission means 30 are respectively secured via screw holes 30a and 30d to the adapter member 8 and the lens body (or a projecting part of the bayonet ring carrying ring 4). Meanwhile, the intermediate portion of the signal transmission means 30 is left unfixed. FIGS. 4A and 4B show the electrical signal transmission means 30 disposed within a space between the adapter member 8 and the bayonet ring carrying ring 4. In FIGS. 4A and 4B, the adapter member 8 and the bayonet ring carrying ring 4 are schematically shown with annular shapes. Since the middle or intermediate portion of the electrical signal transmission member 30 is left unfixed while the member 30 is made of a flexible material folded back into the U-shape, the folded portion is shiftable from a position X1 to another position X2 accordingly as the lens body rotates when the main support tube 1 of the lens body is turned around the optical axis with the adapter member 8 non-rotatably fixed to the camera side. Therefore, the electrical signal transmission member 30 has its folded portion freely movable within the space between the adapter member 8 and the bayonet ring carrying ring. 4. Again referring to FIG. 2, the arrangement of the lens drive control unit 32 is such that the lens drive control unit 32 comprises: a case 36 mounted on the main support tube 1; a motor 38; gear trains G1 and G2 disposed between the shaft of the motor 38 and a toothed part 2a formed on the periphery of the distance ring 2; and a circuit substrate 34 (see FIG. 3) of an electrical circuit which is provided for controlling the rotating direction, rotational frequency or power supply time of the motor 38.

Figure 5:
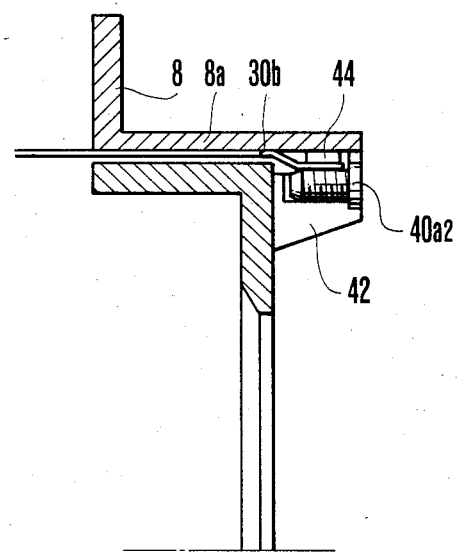
FIGS. 5 through 8 show an arrangement of input-and-output means (or signal receiving-and-producing means).
Figure 6:
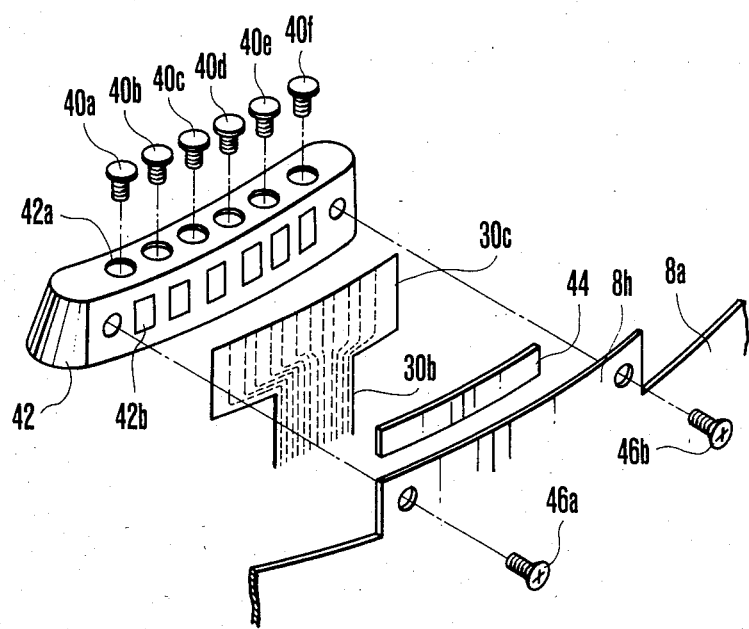
Figure 7:
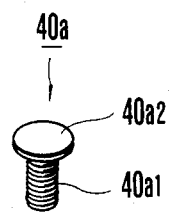

FIG. 5 is an enlarged view of the part A which comprises the electrical signal receiving-and-producing means shown in the dotted circle of FIG. 2. The details of this part are as shown in FIGS. 6 and 7. Referring to FIGS. 5, 6 and 7, a portion of the cylindrical part 8a of the adapter member 8 includes a projected portion 8h which extends in the direction of the optical axis. There are provided signal pins 40a, 40b, ---, and 40f; a carrying member 42 arranged to carry the signal pins 40a–40f; and an insulating rubber part 44. The carrying member 42 is mounted on the projected portion 8h by means of screws 46a and 46b. In this instance, the carrying member 42 is provided with a plurality of openings 42a and 42b which are arranged in two directions, one around the optical axis and the other in parallel therewith. The arrangement is such that when the signal pins 40a–40f are screwed into the openings 42a aligned on one side, the stem part 40a1 of each of the signal pins 40a–40f comes to be exposed through the openings 42b aligned on another side of the carrying member 42. Meanwhile, a conductive pattern is formed on the connection part 30c of the electrical signal transmission member 30. The carrying member 42 is attached to the projected portion 8h with the conductive pattern allowed to abut on the exposed stem parts of the signal pins and with the insulating rubber part 44 inserted there. FIG. 7 shows the signal pin 40a. The pin is made of a conductive material and has a head part 40a2 which is of a larger diameter than the stem part. Other signal pins are also prepared in the same manner as the signal pin 40a.

Figure 8:
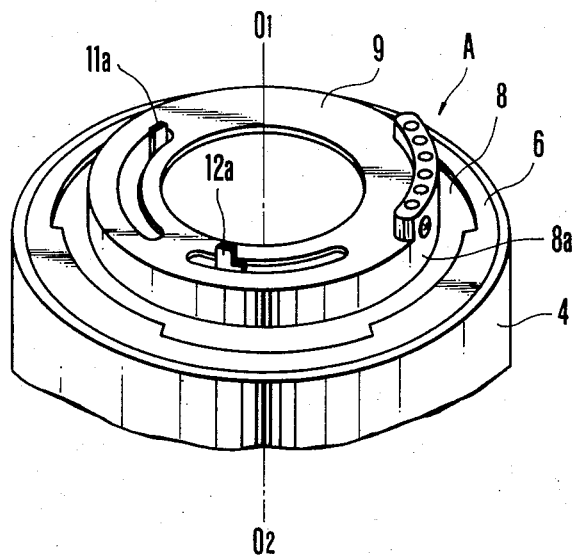

The mounting part of the lens barrel of the novel type having the signal receiving-and-producing device according to the invention is shown in FIG. 8.

With the lens barrel of FIGS. 1 and 2 arranged as described in the foregoing, when the lens barrel is mounted on and dismounted from a camera, body (not shown) in the following manner: the adapter member is secured to a predetermined position on the camera body. The signal pins 40a–40f of the signal receiving-and-producing means A on the adapter member abut on signal pins which are not shown but are disposed on the side of the camera body. As described in the foregoing with reference to FIGS. 4A and 4B, the flexible signal transmission member 30 has both ends 30a and 30d fixed while the middle portion thereof including the folded portion is arranged to be in a free state. Therefore, the signal transmission member is never twisted or distorted when the lens body is turned around the optical axis thereof during a mounting or dismounting operation thereon. Therefore, electrical signals can be smoothly transmitted between the signal pins on the fixed adapter member and the circuit substrate 34 arranged within the drive control unit on the lens body. In accordance with this invention, the signal transmission member 30 is prepared, for example, either with a flexible printed circuit board or with solid lead wires arranged into plate- or strip-like ribbon lines. This arrangement permits reduction in clearance between the adapter member and the bayonet ring carrying ring 4. Therefore, the present invention can be applied to a lens barrel without hindering reduction in size and weight. In accordance with this invention, the arrangement of the signal transmission member 30 folded approximately into a U-shape obviates the necessity of providing a clearance over the whole circumference around the optical axis between the adapter member and the projected part 4b of the bayonet ring carrying ring 4. This effectively saves the lens barrel structure from becoming complicated.

Figure 9A:
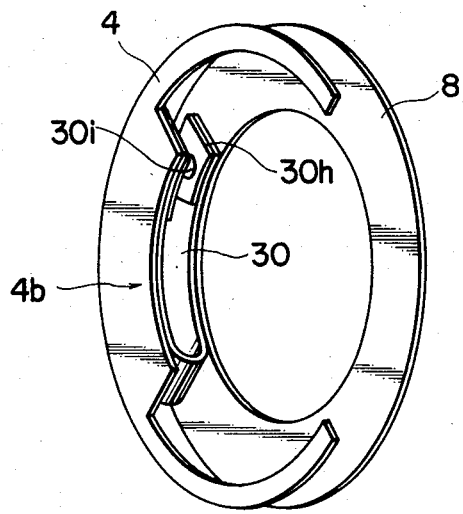
FIGS. 9A and 9B are illustrations of reinforcement provided for the signal transmission member.
Figure 9B:
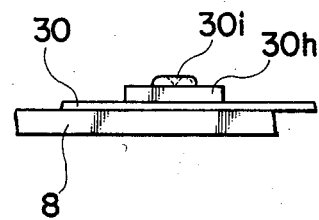

The fixed ends of the strip-like flexible signal transmission member 30 are reinforced in a manner as shown in FIGS. 9A and 9B. These ends of the member 30 are fixed not directly to the adapter member and the projected part 4b of the bayonet ring carrying ring 4 but are fixed with reinforcement plates 30h made of a resin, rubber or bakelite material or the like inserted there as shown in FIG. 9B. The strength of the fixed parts can be thus increased by this reinforcement to ensure long or continuous use of the lens barrel (mounting and dismounting of the lens barrel in a continuous manner) without any trouble.

Figure 11A:
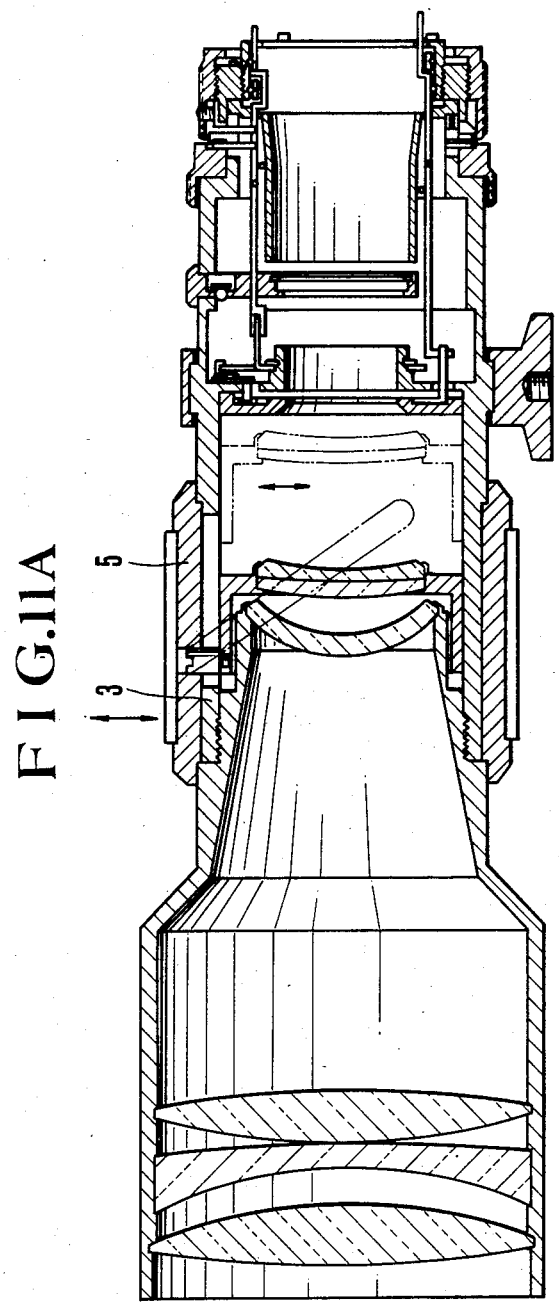
FIGS. 11A and 11B are sectional illustrations showing by way of example a lens barrel in which an operation member is arranged to be turned round a fixed shell.

It is a feature of the invention that electrical signal transmission between members is carried out with the strip-like flexible signal transmission member arranged between relatively rotating members to be movable relative thereto. In the specific embodiment shown in FIGS. 1 through 9, the invention is applied to the mounting device for a lens barrel. However, the invention is applicable also for other purposes. For example, the invention may be applied to a lens barrel of the kind in which an operation member (for focusing or zooming) is disposed on the outer circumference of a fixed shell and the lens is shifted and controlled by turning the operation member on the outer circumference of the fixed shell. U.S. Pat. No. 4,045,128, for example, discloses a lens barrel of this kind as represented by FIG. 11A. In this instance, the operation member 5 is turned around the optical axis of the lens during focusing. In the case of a lens barrel of such structural arrangement as disclosed in U.S. Pat. No. 4,045,128, if it becomes necessary to have electrical signal exchange between a fixed shell 3 and an electric element or circuit or the like arranged, for example, on the outer circumference of the operation member 5, the strip-like flexible signal transmission member 30 can be advantageously used for that purpose.

In a zoom lens barrel of the kind arranged to have an operation member operated by shifting it in the direction of the optical axis of the lens for a zooming operation, if the zoom lens barrel is required to have electrical signal transmission carried out between the operation member and a fixed shell thereof, the use of the flexible wiring member (or signal transmission member) which is folded back in the longitudinal direction thereof according to the invention would be extremely advantageous.

Figure 10A:
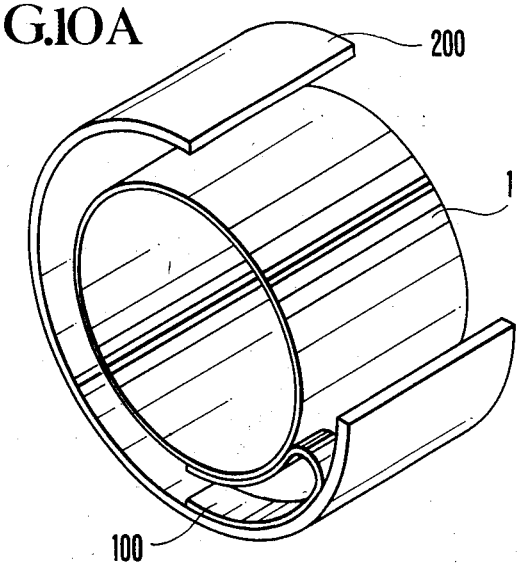
FIGS. 10A and 10B are schematic illustrations of another embodiment of the invention.
Figure 10B:
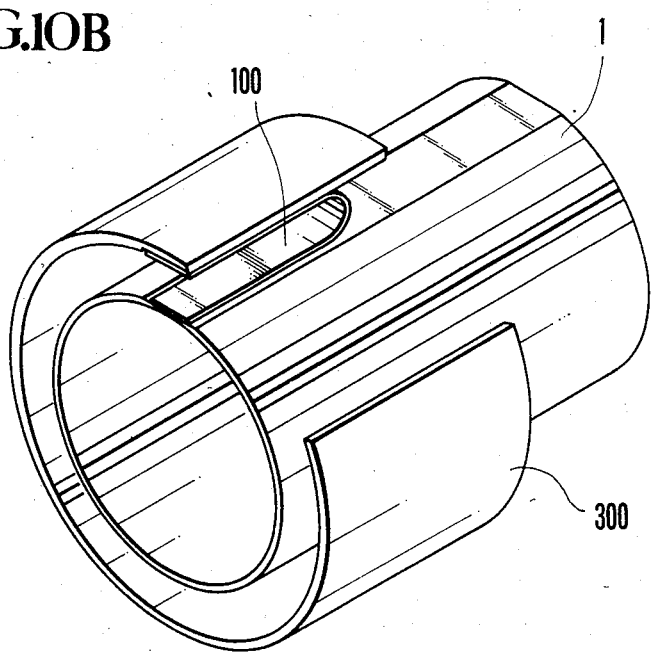

FIGS. 10A and 10B show the above-stated application examples. FIG. 10A shows the positional relation of a wiring member 100 to an operation member 200 which is arranged to be turnable around a fixed shell 1. FIG. 10B shows the wiring member 100 in relation to an operation member 300 which is arranged on the outside of a fixed shell 1 to be linearly operated along the optical axis of the lens barrel.

Figure 11B:
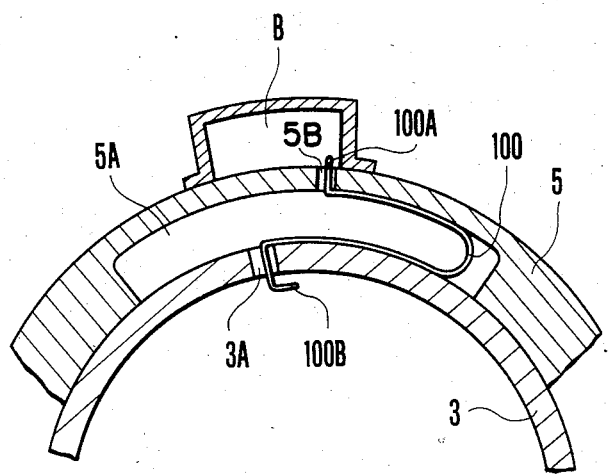

FIGS. 11A and 11B show an example wherein the invention is applied to the above-stated lens barrel which is disclosed by U.S. Pat. No. 4,045,128 and is arranged to have an operation member to be turnable around the optical axis. Referring to FIGS. 11A and 11B, the lens barrel is provided with a space 5A between an operation member 5 and a fixed shell 3 for having the strip-like flexible signal transmission member 100 arranged therein for electrical signal transmission between the operation member 5 and the fixed shell 3. As shown in FIG. 11B, an electric unit B is disposed on the operation member 5 which is turnable around the optical axis of the fixed shell 3. Meanwhile, a signal receiving-and-producing (input-and-output) device which is arranged as shown in FIG. 8 (not shown in FIG. 10B) is provided at one end of the fixed shell 3 facing the camera body. Between the operation member 5 and the fixed shell 3 is arranged the flexible signal transmission member 100 which is folded back in the longitudinal direction thereof. The signal transmission member 100 has one end 100A thereof guided into the electric unit B via a hole 5B to be electrically connected to an electric element or a circuit substrate which is not shown but is arranged within the unit B. The other end 100B of the member 100 extends along the inner circumference of the fixed shell forward the camera body to be electrically connected to the above-stated signal receiving-and-producing device. With the flexible signal transmission member 100 arranged in this manner, a turning operation on the operation member causes no problems such as twist or entanglement of the wiring provided for electrical signal transmission.

A further embodiment which is shown in FIG. 12 relates to a photo-taking lens barrel having an operation member arranged to be movable along the optical axis thereof. A zoom lens barrel arranged to be operated in this manner is, for example, disclosed by U.S. Pat. No. 4,322,150. In the zoom lens barrel of U.S. Patent, wherein an operation member 15 is linearly operated in the direction of the optical axis to shift and control a variator lens L3 and a compensator lens L4 for zooming. In case that an electric unit to be electrically controlled is provided on the operation member 15, electrical signal transmission can be simply carried out between the electric unit on the operation member and a fixed shell by using the flexible wiring member arranged according to the present invention. As shown in FIG. 12, a flexible wiring member 110 is arranged with the member 110 folded back in the longitudinal direction thereof between the fixed shell 1 and the operation member 15. One end of the member 110 is guided via a hole which is not shown but is provided in the operation member 15 to the inside of an electric unit C to be electrically connected to a motor, an electrical element or a circuit substrate disposed within the electric unit C. The other end of the flexible wiring member 110 is extended along either the inner or outer circumference of the fixed shell 1 toward the camera body to be electrically connected to a signal receiving-and-producing (input-and-output) device A which is not shown but is provided on the fixed shell as shown in FIG. 8.

With the lens barrel arranged in this manner, the linearly moving operation on the operation member 15 along the optical axis never causes any distortion and entanglement of the wiring member 110, so that electrical signals can be transmitted reliably.

While specific embodiments of the invention have been shown and described in detail to illustrate the application of the inventive principles, it will be understood that the invention may be embodied otherwise without departing from such principles.

What we claim:

1. An interchangeable photographic lens assembly adapted to be attached to and detached from a camera, comprising;
    adapter means adapted to be fixed to a predetermined position on said camera;
    a lens body arranged to be rotatable around an optical axis of the lens assembly relative to said adapter means, said lens body being provided with a photographic lens and means to be driven by an electrical signal from said camera;
    means for receiving and producing electrical signals, said means being carried by said adapter means and arranged to be connected to signal receiving-and-producing means disposed on the side of said camera; and
    electrical signal transmission means comprising a flexible printed circuit board for electrical signal transmission between said adapter means and said lens body, said signal transmission means having one end thereof connected to said signal receiving-and-producing means of the lens assembly and the other end thereof carried by said lens body to permit electrical signal transmission between said signal receiving-and-producing means and said means to be driven,
    said electrical signal transmission means being disposed between said lens body and said adapter means and being folded back into an approximate U-shape, said two ends of said signal transmission means being fixedly carried by said lens body and said adapter means, with the folded portion and portions in the neighborhood thereof being left unfixed to permit the folded portion to be displaced according to the rotation of the lens body,
    said flexible printed circuit board being formed into an open ring shape with a plurality of conductive patterns being arranged thereon from one end to the other with conductive patterns at one end of said circuit board being connected to electrical signal contacts forming said signal receiving-and-producing means, the conductive patterns at the other end thereof being connected to a circuit board secured to said lens body.

2. An assembly according to claim 1, wherein said means to be driven comprise a motor arranged to shift and control said photographic lens assembly along an optical axis thereof.

3. An assembly according to claim 1, wherein said means to be driven comprise light quantity control means arranged to receive a control signal from said camera through said signal receiving-and-producing means and said electrical signal transmission means.

* * * * *